US006535949B1

(12) United States Patent
Parker

(10) Patent No.: US 6,535,949 B1
(45) Date of Patent: Mar. 18, 2003

(54) PORTABLE ELECTRONIC DEVICE HAVING A LOG-STRUCTURED FILE SYSTEM IN FLASH MEMORY

(75) Inventor: Kenneth W. Parker, Nazareth, PA (US)

(73) Assignee: Research In Motion Limited, Waterloo (CA)

( * ) Notice: Subject to any disclaimer, the term of this patent is extended or adjusted under 35 U.S.C. 154(b) by 0 days.

(21) Appl. No.: 09/294,934

(22) Filed: Apr. 19, 1999

(51) Int. Cl.⁷ .............................................. G06F 12/00
(52) U.S. Cl. ....................... 711/103; 711/159; 707/205; 707/206
(58) Field of Search ................................ 707/205, 206, 707/101; 711/103, 104, 105, 159, 111–115, 154, 160, 173

(56) References Cited

U.S. PATENT DOCUMENTS

| | | |
|---|---|---|
| 5,418,925 A | 5/1995 | DeMoss et al. |
| 5,448,719 A | 9/1995 | Schultz et al. |
| 5,488,701 A | 1/1996 | Brady et al. |
| 5,530,850 A | 6/1996 | Ford et al. |
| 5,537,588 A | 7/1996 | Engelmann et al. |
| 5,550,998 A | 8/1996 | Willis et al. |
| 5,551,003 A | 8/1996 | Mattson et al. |
| 5,555,371 A | 9/1996 | Duyanovich et al. |
| 5,600,596 A | 2/1997 | Shirakihara |
| 5,630,093 A | 5/1997 | Holzhammer et al. |
| 5,644,539 A | 7/1997 | Yamagami et al. |
| 5,666,114 A | 9/1997 | Brodie et al. |
| 5,666,530 A * | 9/1997 | Clark et al. .................. 707/201 |
| 5,666,532 A | 9/1997 | Saks et al. |
| 5,677,953 A | 10/1997 | Dolphin |
| 5,682,497 A | 10/1997 | Robinson |
| 5,748,537 A | 5/1998 | Garbers et al. |
| 5,781,472 A | 7/1998 | Sweha et al. |
| 5,787,445 A * | 7/1998 | Daberko ..................... 707/205 |
| 5,793,696 A | 8/1998 | Tanaka et al. |
| 5,832,515 A | 11/1998 | Ledain et al. |
| 6,069,827 A * | 5/2000 | Sinclair ................. 365/185.29 |
| 6,157,935 A * | 12/2000 | Tran et al. ................... 707/503 |

OTHER PUBLICATIONS

Atsuo Kawaguchi et al., A Flash–Memory Based File System, in USENIX Technical Conference, 1995.*

(List continued on next page.)

Primary Examiner—Matthew Kim
Assistant Examiner—Woo H. Choi
(74) Attorney, Agent, or Firm—Jones Day; Krishna K. Pathiyal, Esq.; Charles B. Meyer, Esq.

(57) ABSTRACT

A portable electronic device includes a log-structured file system implemented in flash memory, The log-structured file system includes a write function for storing contiguous data records to the flash memory in the form of at least one data log, although the system may write data records to the flash memory using a plurality of data logs. The log-structured file system also includes a read function for retrieving data records from the one or more logs using a plurality of memory mapped pointers, which may be stored in an associated RAM index, or which may be implemented as an index stored in the flash memory. A clean-log function is also provided for eliminating inactive records from the log so that new data can be appended to the end of the log. The various functions associated with the log-structured file system are implemented as at least three software modules, a read module, a write module and a clean-log module, although other configurations are possible. The portable electronic device may include a two-way RF transceiver for sending and receiving data from the device, and may also include a plurality of application programs that are configured to interact with the log-structured file system, as well as other software modules for controlling the operation of the portable electronic device.

12 Claims, 8 Drawing Sheets

OTHER PUBLICATIONS

Andrew S. Tanenbaum, Operating System—Design and Implementation, Prentice–Hall, 1987.*

Margo Seltzer et al., An implementation of a Log–Structured File System for UNIX, Winter USENIX, 1993.*

Maurice J. Bach, The Design of the UNIX OPerating System, Prentice–Hall, 1986.*

Mei–Ling Chiang et al., Managing Flash Memory in Personal Communication Devices, IEEE, 1997.*

"Beating The I/O Bottleneck: A Case For Log–Structured File Systems," Ousterhout, John; Douglis, Fred; Computer Science Division, Electrical Engineering and Computer Sciences, University of California at Berkeley; Oct. 30, 1988; pp. 11–28.

"The Design and Implementation Of A Log–Structured File System," Rosenblum, Mendel; Ousterhout, John; Electrical Engineering and Computer Sciences, University of California at Berkeley, pp. 1–15.

* cited by examiner

PORTABLE ELECTRONIC DEVICE HAVING A LOG-STRUCTURED FILE SYSTEM IN FLASH MEMORY

BACKGROUND OF THE INVENTION

1. Technical Field

The present invention is directed to the field of data storage and retrieval in portable electronic devices typically having limited processing and memory capabilities, such as two-way wireless paging computers, PDAs, P/PCs, H/PCs, etc. More particularly, the present invention provides a portable electronic device having a software-implemented log-structured file system for storing and retrieving data from an electrically-erasable flash memory store. The system preferably stores data in at least one log as a plurality of contiguous variable-length records. The invention also provides memory mapped pointer access to the individual data records. Alternatively, certain implementations of the invention provide: (1) a plurality of logs for storing records that change at different relative frequencies in order to improve system performance; and (2) storing multiple versions of the data records in the log.

2. Description of the Related Art

Portable electronic devices are typically characterized by limited electrical power, limited processing capability and limited storage capacity. Since these devices are portable, they must also be light-weight and small. Thus, it is desirable to provide such a portable electronic device with a memory storage medium that is low power, small in size, high-capacity, and rugged. Semi-conductor chip memories have proven useful in meeting these requirements.

Particularly useful for this application is flash memory. Flash memory is a type of electrically-erasable programmable read-only memory. Flash is a non-volatile memory characterized by a plurality of memory cells implemented with a floating-gate field effect transistor ("FET"). An electrical charge can be permanently trapped on the floating gate of the FET, thus effecting a write operation to the memory cell. Trapping a charge on the floating gate ("programming") requires only modestly more time than charging the gate of an FET used in dynamic random access memory ("RAM"), and requires no special control circuitry. However, removing the trapped charge ("erasing") takes significantly longer for flash, and requires expensive on-chip circuitry. In currently available flash memories, this erase time may be as much as two orders of magnitude slower than the programming time. As a result, flash manufacturers provide a fine-grain mechanism for imparting charges to the floating gate, perhaps as small as a few bytes at a time, and a coarse-grain mechanism for removing charge from the floating gate, perhaps a block of many kilobytes.

Presently known portable electronic devices have file systems that store data in a flash memory using intermediate block-sized RAM buffers to store active data (i.e., the RAM buffer is at least as large as one block of flash memory). Updates to the data are performed in the RAM buffer. Reads are performed by accessing the RAM buffer. Periodically, the contents of the RAM buffer replaces the contents of the particular flash memory block to which it is temporarily referenced. Another flash block can then be read into the RAM if different data becomes active.

These types of portable electronic devices suffer from many disadvantages. First, these systems are prone to lose data. If important data is stored in the RAM buffer (a volatile storage media) and has not been programmed into the flash device, and power is lost, then the important data is also lost. In order to cure this problem, these devices must flush the RAM buffer(s) to flash memory before committing a transaction, and as a result they typically flush the RAM buffer(s) at frequent rates. But this results in low write-efficiency to the flash memory since a buffer flush requires an erase step and a programming step for the entire flash block. The frequency of flushing the buffer may additionally result in shorter lifetime for the flash, which degrades as the number of erases increases. Secondly, a large amount of RAM is required in these systems since current flash memory devices include large block sizes, typically on the order of 64 Kbytes or greater. The overhead cost in accessing the flash through RAM buffers also extends to applications operating on the portable device. These applications must also maintain RAM buffers in order to read and write to the RAM buffers in the file system. Thus even more RAM is required to support the file system. More RAM results in increased cost and size of the portable electronic device. And finally, these devices typically exhibit low read efficiency because of the overhead in calling the operating system, performing a context switch, possibly changing protection domains, and in trying to decide if the most up to date copy of the data is in RAM or the flash memory.

Therefore, there remains a general need in this field for a portable electronic device having a data storage and retrieval system for storing data in flash memory that overcomes the many disadvantages of the presently known devices.

SUMMARY OF THE INVENTION

A portable electronic device is provided that includes a log-structured file system implemented in flash memory. The log-structured file system preferably includes a write function for storing contiguous data records to the flash memory in the form of at least one data log, although alternatively, the system may write data records to the flash memory using a plurality of data logs that may be arranged in parallel, hierarchically, or both. The data records are preferably linked together in a linked-list structure, including a record header for maintaining link data, and the linked records may further form a plurality of files that may also be linked together in a linked-list structure. The log-structured file system also preferably includes a read function for retrieving data records from the one or more logs using a plurality of memory mapped pointers, which may be stored in an associated RAM index, or which may be implemented as an index stored in the flash memory. A clean-log function is also provided for eliminating inactive records from the log so that new data can be added.

The various functions included with the log-structured file system are preferably implemented as at least three software modules, a read module, a write module and a clean-log module, although other modules and configurations are possible. The portable electronic device may further include a two-way RF transceiver for sending and receiving data from the device, and may also include a plurality of application programs that are configured to interact with the log-structured file system and as other software modules for controlling the operation of the portable electronic device.

According to one aspect of the invention, a portable electronic device is provided that includes a microprocessor, an electrically erasable flash memory store, a two-way radio-frequency transceiver, and a log-structured file system for storing data in the flash memory store. In this aspect of the invention, the log-structure file system includes: (a) a write software module for writing data to the flash memory as a sequence of contiguous records; (b) a read software module for reading data from the flash memory using a plurality of memory mapped pointers into the flash memory store; and (c) a clean-log software module for cleaning inactive records from the flash memory store in order to make room for additional data. The microprocessor preferably executes the software modules of the log-structured file system in order to write data to the flash memory, read data from the flash memory, and clean inactive records from the flash memory, and also controls sending and receiving data from the portable electronic device via the two-way radio-frequency transceiver.

Another aspect of the invention provides a portable electronic device including a log-structured file system for storing a log of contiguous data records in a flash memory store, and for reading data from the flash memory store using a plurality of memory mapped pointers that reference the individual data records. Additionally, the plurality of memory mapped pointers may be stored in a RAM associated with the portable electronic device, or they may be stored in an index in the flash memory store. A two-way radio-frequency transceiver for sending and receiving data over a wireless data network is alternatively included.

In another aspect of the invention, a portable electronic device is provided that includes a flash memory store and a log-structured file system for storing a plurality of logs of contiguous data records in the flash memory store, and for reading data from the flash memory store using a plurality of memory mapped pointers that point to the individual data records, wherein at least one of the logs of contiguous data records stores relatively-volatile data records (i.e., those data records that change with relatively high frequency), and at least one other log stores relatively-involatile data records (i.e., those data records that change less frequently than those stored in the first log). Alternatively, the log that stores the relatively-volatile records is termed the "hot" log, and the log that stores the relatively-involatile records is termed the "cold" log. There may be multiple levels of hot and cold logs depending upon the implementation.

Still another aspect of the invention provides a portable electronic device for sending and receiving data via a wireless digital data network. A device according to this aspect of the invention includes a microprocessor, an electrically erasable flash memory store, a two-way radio-frequency transceiver, and a log-structured file system for storing the data in the flash memory store, the log-structure file system including a write software module, a read software module and a clean-log software module. In this aspect of the invention, the microprocessor executes the software modules of the log-structured file system in order to write data to the flash memory, read data from the flash memory, and clean inactive data from the flash memory, and controls sending and receiving data from the portable electronic device over the wireless digital data network via the two-way radio-frequency transceiver.

Yet another aspect of the invention provides a two-way wireless paging computer, comprising: a microprocessor; an RF transceiver for sending and receiving data; a flash memory store for storing data sent and received by the two-way wireless paging computer; and a log-structured file system under the control of the microprocessor for storing one or more data logs in the flash memory store, the log-structured file system including software modules for writing contiguous data records to the log, for reading data records from the log, and for cleaning the log by removing inactive data records from the log to make room for new data records.

These are just some of the many aspects of the invention that will become apparent from reviewing the detailed description of the drawings, set forth below. Other aspects not specifically noted, or which are insubstantially different, or which include elements that are substantially the same as those shown in the detailed description are within the scope of the present invention.

The present invention overcomes the disadvantages of presently known portable electronic devices storing data in flash memory, and also provides many advantages. Two of the primary advantages of the present invention are improved write efficiency and improved read efficiency. Better write performance is achieved in the present invention by rejecting the traditional paradigm for writing to flash, i.e., through a RAM buffer. This traditional approach to storing data in flash memory disadvantageously selects locations for writes that force an erase to be performed before any write can be committed to memory, thus resulting in a view of flash memory as a storage device with fast read times but slow overall write times. By distinction, the log-structured file system implemented in the present invention divorces erases from writes, resulting in a view of flash memory as a storage device with three operations: fast reads, slightly slower writes, and very slow bulk erases. Using the teaching of the present invention, application programs operating on the portable electronic device can write data on demand, but the system delays the flash memory erase cycle until more convenient time, such as when the device is idle. Thus, application programs and their users do not have to wait through an erase operation, as is generally the case with presently known devices.

Better read efficiency is achieved by also rejecting the paradigm of a RAM buffer. The present invention recognizes that, although flash is used as a non-volatile data storage device like a magnetic disk or tape, it has read characteristics that are similar to RAM, e.g., fine granularity of data to be read and high read speed. Instead of reading through a RAM buffer, the present invention returns a pointer directly into flash that references the record to be accessed. Because the record is contiguous, the application program can then read the data directly from flash by dereferencing the pointer within the length of the record. Using this technique, the present invention eliminates both the transfer time and the overhead time for a context switch necessary with the RAM buffer approach.

Other advantages of the present invention include: (1) operates on less RAM than presently known systems, while maintaining support for applications that manipulate relatively large data files; (2) reduces the potential for data loss caused by a system reset; (3) by storing data as a plurality of contiguous records, the present invention enables applications to reference data using memory mapped pointers into the file system, which also enables easier programming of applications; and (4) retains and, in some cases improves upon, the characteristics desirable in portable electronic devices, such as low power consumption, small size, low weight, and low price.

These are just a few of the many advantages of the present invention, as described in more detail below in terms of the preferred embodiments. As will be appreciated, the invention is capable of other and different embodiments, and its several details are capable of modifications in various respects, all without departing from the spirit of the invention. Accordingly, the drawings and description of the preferred embodiments set forth below are to be regarded as illustrative in nature and not restrictive.

BRIEF DESCRIPTION OF THE DRAWINGS

The present invention satisfies the general need noted above and provides many advantages, as will become apparent from the following description when read in conjunction with the accompanying drawings, wherein.

DETAILED DESCRIPTION OF THE DRAWINGS

1. Hardware Description

Figure 1:
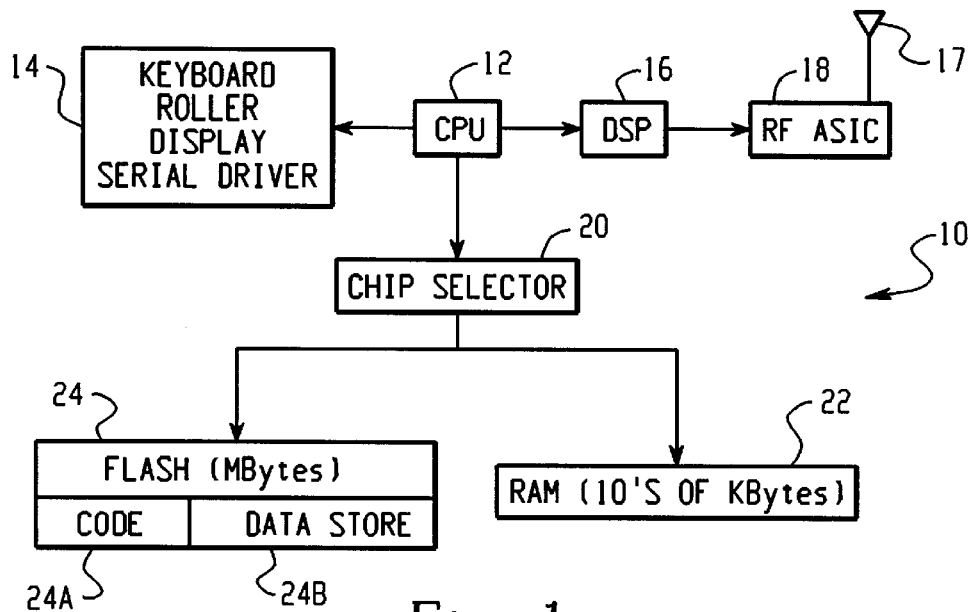
FIG. 1 is a block diagram of a preferred hardware architecture for a portable electronic device having a log-structured file system implemented in flash memory.

Turning now to the drawing figures, FIG. 1 is a block diagram of a preferred hardware architecture for a portable electronic device 10 having a log-structured file system implemented in flash memory 24 according to the present invention. The portable electronic device 10 preferably includes a central processing unit ("CPU") 12, a chip selector 20, RAM memory 22, and a flash memory store 24. The flash memory store 24 may include a code storage portion 24A and a data storage portion 24B. The preferred portable electronic device 10 shown in FIG. 1 may also include user-interface hardware 14, such as a keyboard, roller, display, and a serial driver, etc. Other user-interface components may also be utilized with the portable electronic device of the present invention. In addition, the preferred device 10 includes a two-way RF transceiver for sending and receiving data from the portable electronic device, the RF transceiver comprising a digital signal processor ("DSP") 16 and an RF ASIC 18.

Although the preferred hardware embodiment of the present invention is shown in FIG. 1, it is to be understood that the present invention can be utilized with any portable electronic device having a flash memory store. In particular, the present invention can be utilized with any type of PDA, paging computer, P/PC, H/PC, or any other type of small, portable electronic data storage device in which system and/or user data is stored in flash memory. The inclusion of the two-way RF transceiver is an optional feature of the invention.

Figure 2:
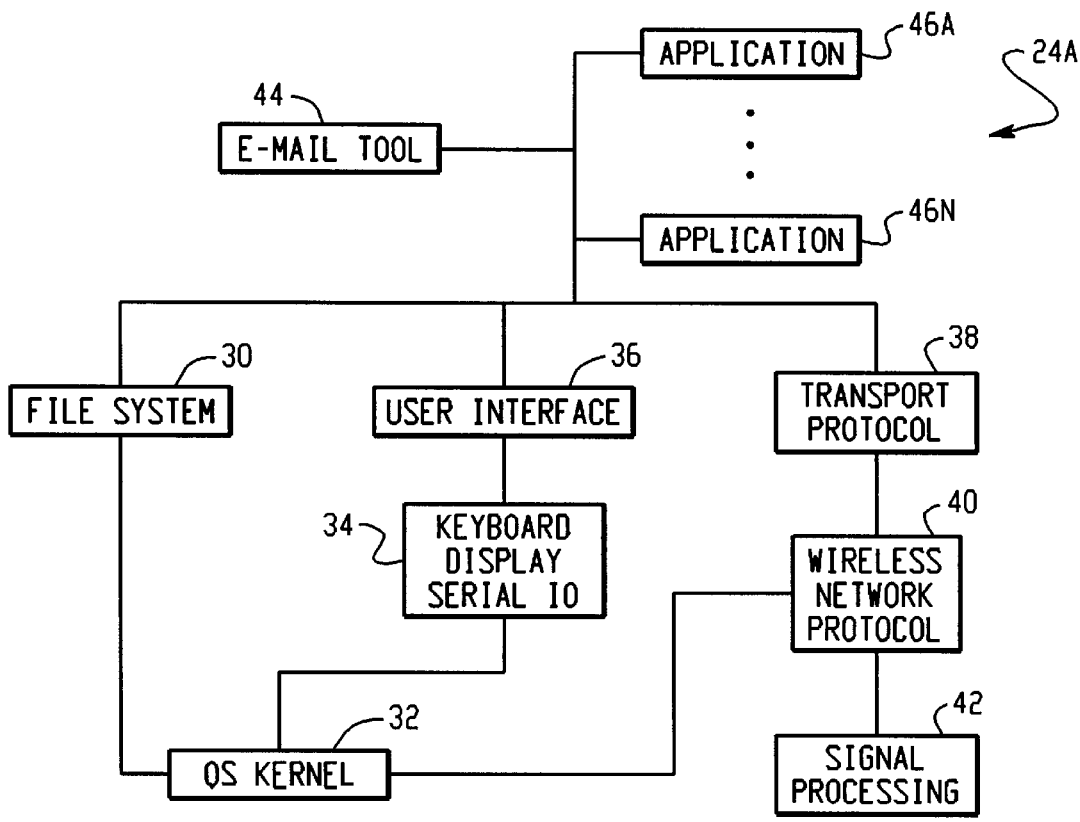
FIG. 2 is a block diagram of a preferred software architecture for the portable electronic device shown in FIG. 1.

Operationally, the CPU 12 controls the functionality of the portable electronic device 10. It is coupled to the user-interface devices 14 in order to receive input from a user of the device, and also to provide output to the user. The CPU 12 preferably executes a plurality of operating system, file system and application software routines, as described in more detail below in connection with FIG. 2. These software routines (or modules) are preferably stored in the code section 24A of the flash memory store 24, although alternatively they may be stored in a OM device, or they could be stored in a battery backed RAM. The inventive log-structured file system (preferably including read, write and clean-log software modules) is preferably stored in code section 24A of the flash memory store 24. These modules are part of the overall software architecture of the portable electronic device 10 (as shown in FIG. 2), dare preferably executed by CPU 12 in order to create the inventive log-structured data store 24B of the present invention. The log-structured data store 24B is described in more detail below in connection with FIGS. 3–5, and the steps carried out by the preferred software modules of the log-structured file system stored in the code section 24A are described in more detail below in connection with FIGS. 6–8.

The CPU 12 is also coupled to a RAM 22 through an optional chip-selector 20. The chip selector 20 couples the CPU 12 to one of the flash memory 24 or the RAM 22 It is important to note that RAM 22 is not a RAM-buffer for reading and writing data to the flash memory 24, as in presently known devices. In the present invention, RAM 22 is primarily used as a scratchpad memory for various applications executed by the CPU 12, and may also be used to store a memory map index of pointers into the data log. This memory map index enables applications operating on the portable electronic device 10 to quickly access any data records in the data store 24B by referencing the appropriate pointer. Alternatively, this memory map may be stored as an index in the flash data store 24B, however, because the data that comprises the index is updated relatively frequently, it is more preferable to store this structure in RAM. In the context of this invention, the term "index" means a data structure or structures that is(are) used to locate particular records. The exact structure of the index may take many forms. It is also important to note that in the present invention only a small RAM is used, on the order of about 10–32 KB, whereas in the presently known devices that use a RAM-buffer to access the flash memory, a much larger RAM would be required, on the order of about 128–256 KB. This is one major advantage of the present invention over conventional technology—less RAM is required—, which in turn reduces the power consumption, size and cost of the portable electronic device 10.

CPU 12 may also be coupled to an external network using the optional two-way RF transceiver comprising DSP 16 and RF ASIC 18. The RF ASIC 18 preferably sends and receives signals from the portable electronic device 10 through an antenna 17 over a wireless data network, preferably a packet data network such as the Mobitex or Ardis networks. Any other wireless interface could also be used, such as CDMA, TDMA, CDPD, etc. The DSP 16 processes these signals and passes the incoming data to the CPU 12. The DSP 16 also processes outgoing data from the CPU 12 and passes the outgoing data to the RF ASIC 18 for transmission on the preferred wireless data network.

2. Software Architecture

FIG. 2 is a block diagram of a preferred software architecture for the portable electronic device shown in FIG. 1. As noted above, the various software components of this preferred architecture may be stored in the code portion 24A of flash memory 24, or could be stored in ROM, RAM or some other non-volatile storage medium of the portable electronic device 10. The preferred software architecture includes an application environment 30–42 and a plurality of applications 44–46N.

The application environment preferably includes an operating system kernel 32, a log-structured file system 30, user interface modules 36, and I/O drivers 34, which may include a keyboard, display, serial, and other drivers. The OS kernel 32 includes the basic system functions for controlling the various hardware elements shown in FIG. 1, and for linking to and communicating with the other modules in the application environment. The log-structured file system 30 of the present invention is described in more detail below in connection with FIGS. 3–9. It should be noted however, that the file system 30 is in communication with the OS kernel 32, and also couples to the numerous application programs 44–46N, which are configured to read and write data to the data store 24B of the flash memory 24 via the software-implemented modules of the log-structured file system 30. The user interface 36 and I/O modules 34 are configured to control the I/O hardware elements 14, such as the keyboard, roller, display or serial driver, and to present a graphical user interface to the user of the portable electronic device 10. The various application programs 44–46N are also in communication with the user interface 36, such that data and I/O options for the particular application are presented through a common user interface. This makes the portable electronic device 10 easier to use, since each application has similar controls and a uniform "look and feel."

There are numerous application programs 44, 46A–46N that can be used with the present invention. Of particular note is an e-mail application 44 for sending and receiving e-mail communications. This application is particularly relevant in the embodiment of the invention having a wireless interface, because a user of the device 10 can then send and receive e-mail no matter where they are located. Other applications that can be included in the device 10 are shown in FIG. 2 as 46A–46N, and may include an organizer, a calendar, a to-do list, an address book, a billable hours module, a timecard module, games, other communication tools, etc. A common feature in each of these applications is that they are configured to read and write data to the device 10 through the inventive log-structured file system 30. In particular, these applications can be configured to read data from the log simply by dereferencing a pointer into the data store 24B, which is retrieved from the memory-mapped pointer index (described in more detail below.) By configuring the applications in this manner, a time-consuming context-switch of the CPU 12 is avoided, thus resulting in far better read performance for the electronic device 10. This is just one of the many advantages of the present invention.

The application environment may also include modules for enabling two-way RF transmission of data via the DSP 16 and RF ASIC 18 shown in FIG. 1. These modules may include a transport protocol 38, a wireless network protocol 40, and signal processing module 42. The transport protocol 38 provides fault-tolerant communications functions to and from the various application programs 44–46N, the wireless network protocol 40 implements the particular network protocol used by the wireless data network associated with the portable electronic device 10, such as the protocol for the Mobitex network, and the signal processing module 42 provides a number of software-implemented signal processing functions (preferably executed by DSP 16) for enabling the portable electronic device 10 to send and receive data in a reliable fashion and under a variety of conditions.

3. Log-Structured File System

Figure 3:
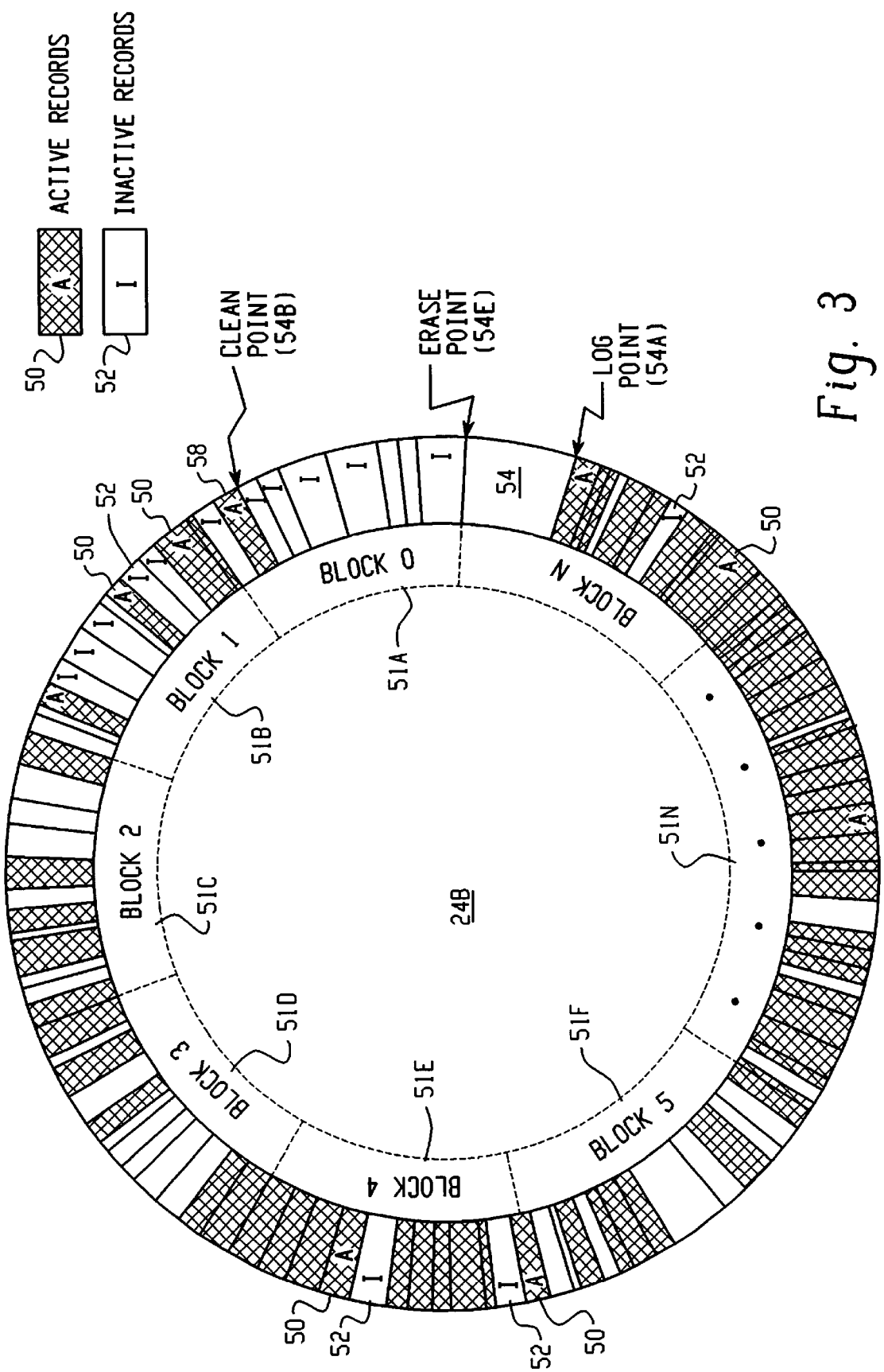
FIG. 3 is a block diagram illustrating the logical layout of records in the log implemented in flash memory.
Figure 4:
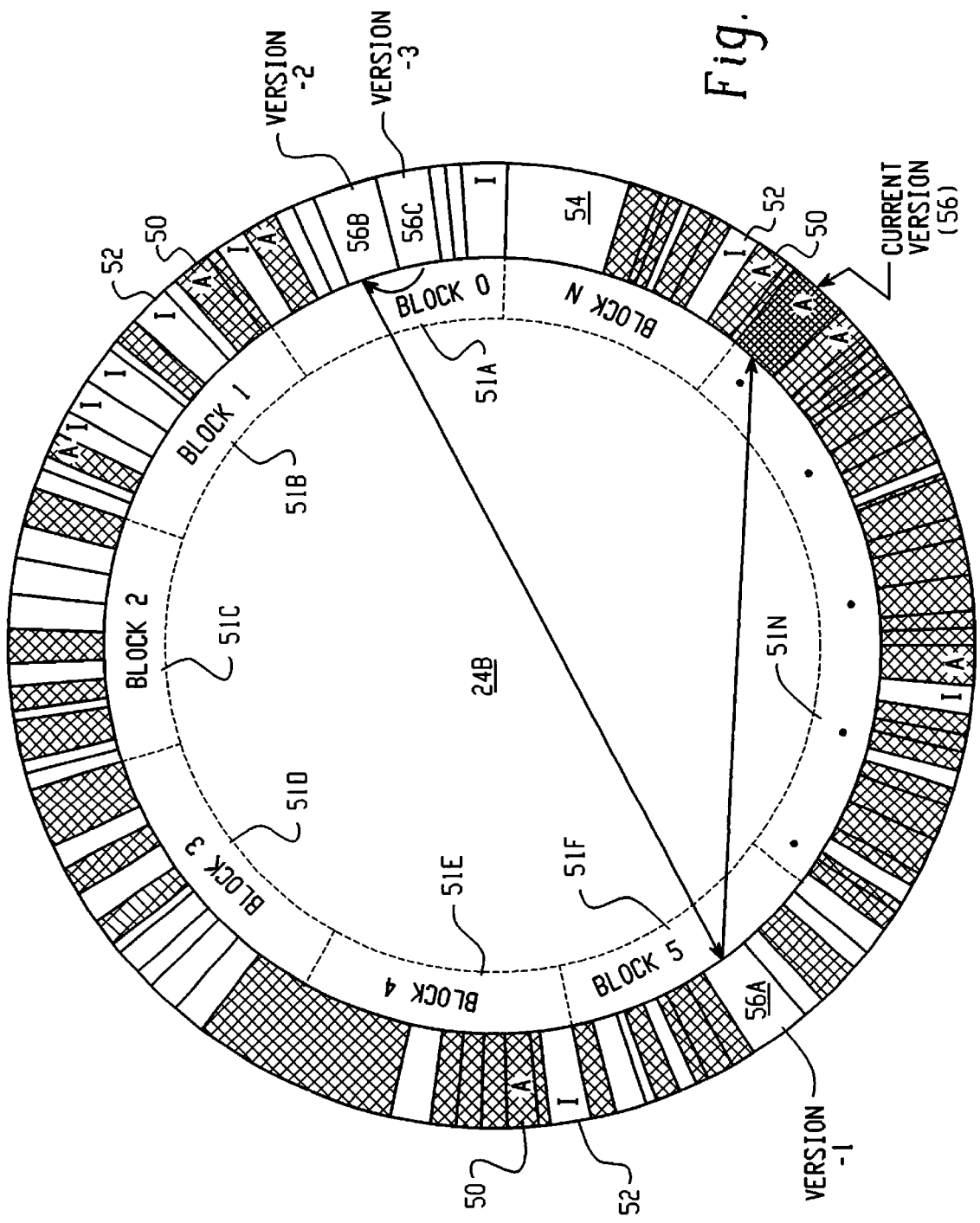
FIG. 4 is a block diagram illustrating how new versions of a modified record are stored in the logical layout of records in the log implemented in flash memory.
Figure 5:
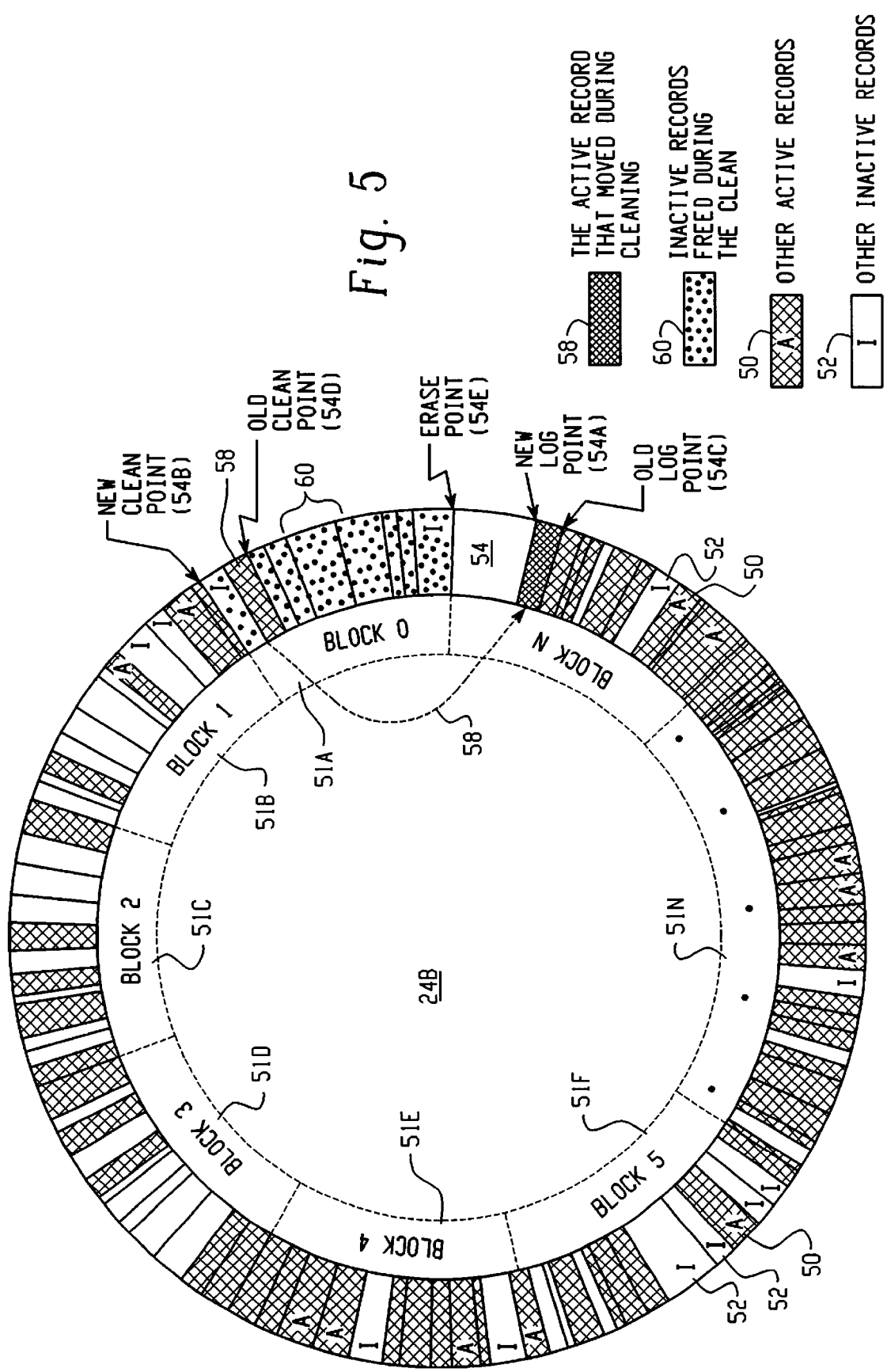
FIG. 5 is a block diagram illustrating a logical view of how the log is cleaned.
Figure 9:
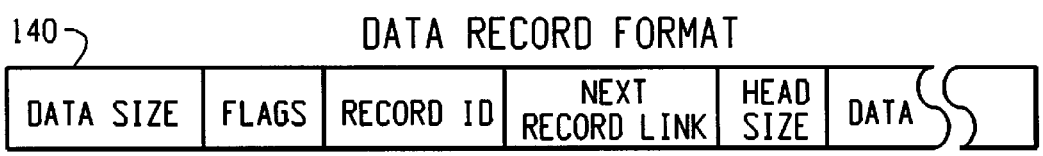
FIG. 9 is a block diagram illustrating a preferred format for data records, file header records, and a root record.
Figure 9:
Figure 9:
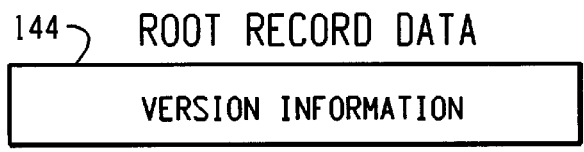

The remaining drawing figures (FIGS. 3–10) describe the inventive log-structured file system 30 of the present invention. This file system 30 is implemented in flash memory 24 as two components, a code portion 24A, which stores the preferred software modules of the file system 30 (and which may also store the software modules of the application environment 32–42 as well as the applications 44–46N), and a data store portion 24B, which may be divided into one or more data logs for storing the variable-length data records. The preferred file system 30 includes at least three modules: a read module, a write module and a clean-log module. These software-implemented modules are described in more detail in connection with FIGS. 6, 7 and 8, respectively. FIGS. 3–5 show an example data log implemented in the data store 24B consisting of a plurality of active and inactive data records stored according to the methodology of the present invention. These figures describe various operations on the log that are associated with the preferred read, write and clean-log modules. FIG. 9 shows example data record, file header and root record formats for the preferred log-structured file system data. And FIG. 10 describes a preferred mode of operation of the portable electronic device shown in FIG. 1 in which cleaning and erasing of the log structured file system is done when the device is idle.

In general, the log-structured file system 30 writes all data onto the end of a "log." This is so even when a write is replacing data that is already stored in the file system. In this case, the previously existing version of the particular data item is marked as "inactive," although it is not immediately removed from the log. As data is written to the end of the log, and the log is extended throughout the memory store. Eventually, as more data is appended onto the log, the system progresses to the end of the memory store, and it then loops back to the beginning of the memory to determine whether certain inactive records can be removed to make space for new data. This later step is referred to as "cleaning" the log. Thus, any log in the data store 24B of the log-structured file system can be viewed as a circular buffer. FIGS. 3–5 present an example data log in this circular-buffer format.

Turning back to the drawing figures, FIG. 3 is a block diagram illustrating the logical layout of records in a single log implemented in the flash data store 24B. As described previously, the system is also capable of creating multiple logs within the data store 24B in order to store records that change at differing frequencies (the "hot" and "cold" concept). The single log 24B shown in FIG. 3 includes a plurality of active records 50 and inactive records 52. Schematically, FIGS. 3–5 include two parts depicted as concentric rings. The outer ring shows the logically layout of the active and inactive data records in the log, and also shows the various system pointers that are used by the log structured file system. The inner ring shows the physically layout of the flash memory devices, which are configured as coarse-grained erase blocks 51A–51N. These erase blocks are labeled "Block 0" to "Block N" to indicate that there may be any number of erase blocks depending on the size of the flash memory data store 24B, and the granularity of the flash device. It should be noted that in a typically flash memory device having these types of coarse-grained erase blocks 51, an entire erase block must be erased at a time.

Each record in the log is a contiguous variable-length entry into the data log 24B. The active records 50 are those records that are the latest version of a particular data item written to the log. Inactive records 52 are those records that have been superceded by a newer version of the same data item. The inactive records 52 are not immediately removed from the log, as this would require a lengthy erase cycle as each record 52 became inactive. Instead, they are maintained in the log until the memory store becomes substantially full, at which time the clean-log module (described in more detail below) consolidates enough space in the log to accommodate new data records.

A data record is stored by appending it to the end of the log. Several pointers are used by the log structured file system to manage the write and clean operations of the log. These pointers include a "Log Point" 54A, "Erase Point" 54E, and "Clean Point" 54B. The current end of the log is generally referred to as the Log Point 54A. The Erase Point 54E indicates the last point that is erased. And the point to which the log could be extended into the next erase block 51A with new data without colliding with old (but active) data is referred to as the "Clean Point" 54B. The space between the Log Point 54A and the Erase Point 54E is the "Log Headroom" 54. The Log Headroom represents the space available in the log for writing new data without having to conduct clean-log and erase-block operations. The space between the Erase point 54E and the Clean Point 54B is the Eraseable Area. The Eraseable Area represents the space in the next flash block 51A that could be erased in order to add space to the Log Headroom. However, because of the physical structure of the flash memory, this area cannot be erased without losing data until the Clean Point extends to the end of the next block 51A. When this happens, the next erase block 51A can be cleaned and erased so that new data records can be appended onto the log into the next block 51A, and the Erase Point is moved to the beginning of the next erase block (or "Block 1") 51B.

Figure 7:
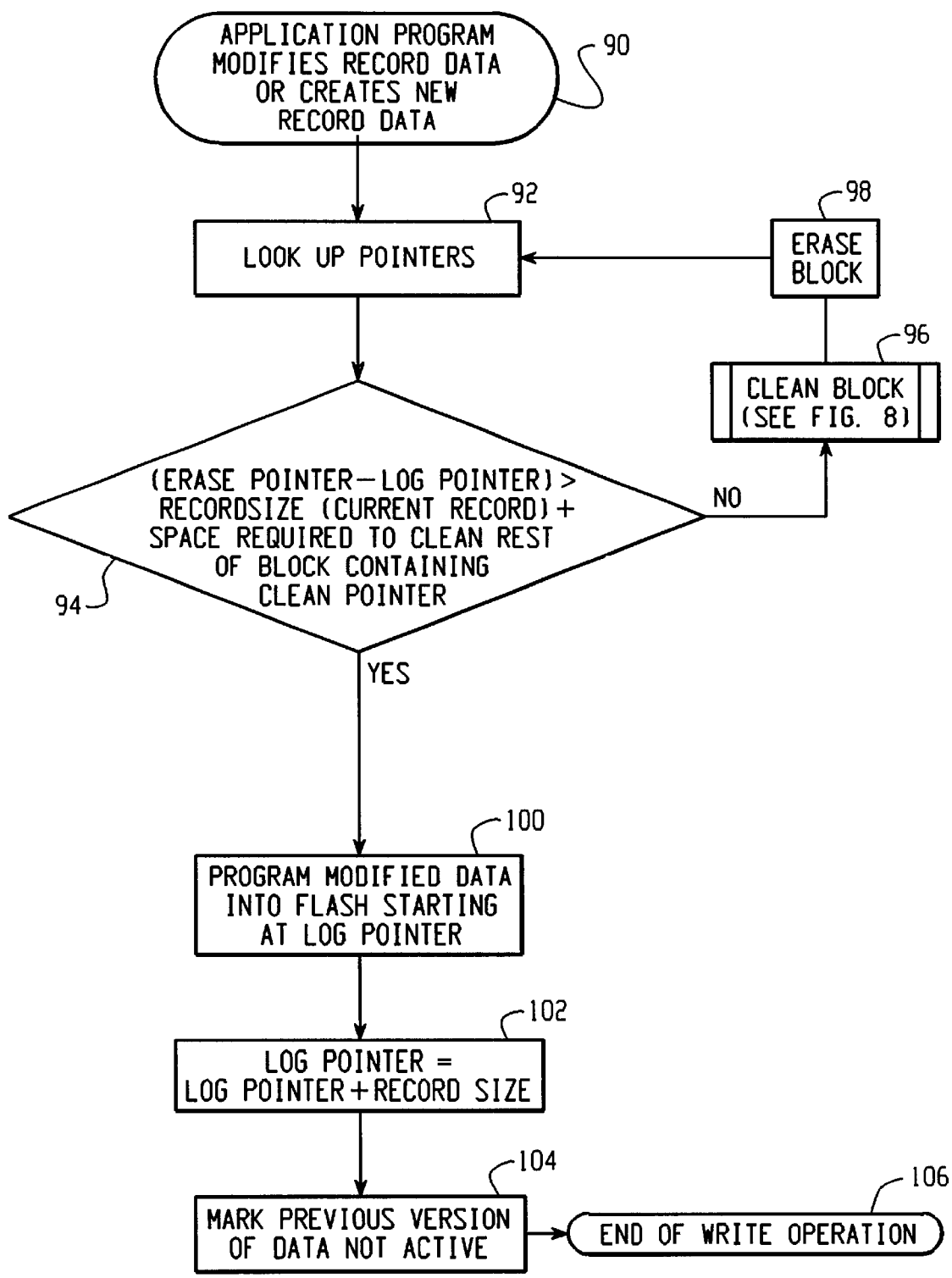
FIG. 7 is a flow chart showing a series of steps carried out by a preferred software implemented write module included in the log-structured file system.
Figure 8:
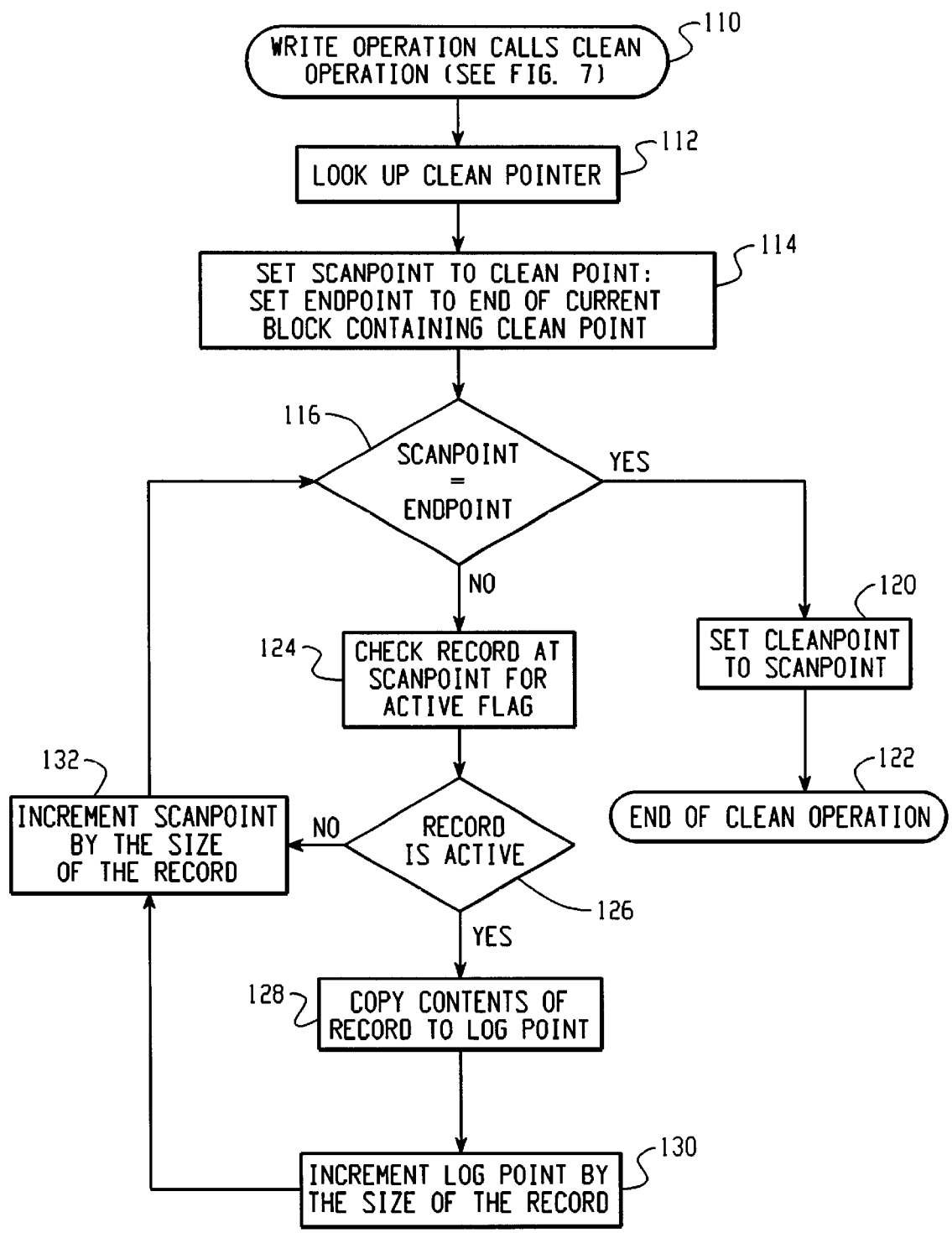
FIG. 8 is a flow chart showing a series of steps carried out by a preferred software implemented clean-log module included in the log-structured file system.

The log structured file system writes the desired data record into a target portion of the flash data store 24B starting at the Log Point 54A and continuing for the length of the desired record (as described in more detail in FIGS. 7–8). In flash memory, a write is physically performed by "anding" the desired values for the new data record to the values in the target portion of the flash data store 24B. This is so because the erasure of the current Log Headroom 54 (either initially or by the cleaning operation) set the values in the target portion of the flash data store 24B to physical "one."

The file system stores the numerous data records as contiguous variable-length blocks (i.e., not fragmented as in a typical disk drive file system). The contiguous nature of this storage technique allows the flash memory 24 to be treated somewhat like a tape drive. As shown in FIG. 9, each record 140 preferably includes a header structure. The header of the data record 140 may include the following fields: (a) data size; (b) flags; (c) record ID; (d) next record link; and (e) header size. The data size field indicates the size in bytes (or some other measure) of the data stored in the particular variable-length record. The flags field includes at least one status bit that indicates whether this record is active or inactive, and may include other flags, such as a version flag indicating the record version, as well as other indications. The record ID identifies the particular record. This field could be a cursor into a table of memory mapped pointers (either stored in RAM or in the flash memory), or it could be part of a multi-level indexing structure that is used to uniquely identify the location of a particular record. The header size field stores the size of the header.

The next record link field is a pointer to the record ID of the record that is linked to this particular record. This field may be used when the records are written to the log as a sequence of linked lists, where a plurality of records in a given list are associated with a particular file. In this case, a file header record 142 may also be used with the system. The file header record 142 includes: (a) flags; (b) a first record link; and (c) a file name. The file header record may also include a next file link to another file, such that the files in the log can also be stored as a linked list. The flags field may contain information regarding whether this is an active or inactive file header, and the first record link may contain the record ID of the first record associated with the particular file. The file name field stores the name of the file.

Also shown in FIG. 9 is a root record. The root record stores version information about the log structured file system that is used at boot of the portable electronic device 10 to determine certain characteristics of the log structured file system that may effect its operation and configuration.

FIG. 4 is a block diagram illustrating how new versions of a modified record are stored in the logical layout of records in the log. In this diagram, the current version of a particular record 56 is shown near the Log Headroom portion 54 of the flash memory store 24B. Prior versions of this same data record, which are labeled as 56A, 56B and 56C are located closer to the front of the log (i.e., closer to the Log Headroom, which precesses in a counter-clockwise fashion around the log structure.) Each of these versions will preferably have a flag set in their headers to indicate that these are "inactive" records. And thus, if the log-structured file system needs to clean additional space from the log, these records can be erased without copying them to another location, since they are not active.

FIG. 5 is a block diagram illustrating a logical view of how the log is cleaned. It is instructive to understand this diagram at two points in time—time T1, which is before the cleaning operation occurs, and time T2, which is after the cleaning operation. At time T1, the Log Headroom 54 is defined by the "Old Log Point" 54C and the Erase Point 54E, and the Eraseable Area is defined by the "Old Clean Point" 54D and the Erase Point 54E. But the system needs more space than that defined by the Log Headroom 54 at time T1, and thus a clean-log and erase block operation must occur. As noted previously, the flash data store 24B is physically divided into a plurality of relatively large erase blocks 51A–51N. The current position of the "Erase Point" 54E at time T1 points to the beginning of the next full data block 51A into which the log can extend. During the clean log operation, the log-structured file system 30 (and in particular the clean-log module) examines the data records that are stored in the next erase block 51A ("Block 0") pointed to by the Erase Point 54E. In the example case shown in FIG. 5, only one active record 58 is found in the erase block 5 1A at time T1. This record 58 cannot be erased since it is active, and therefore it must be moved to another area of the log prior to erasing the block 51A. The other records 60 in the erase block 51A are inactive, and therefore can be erased to create additional headroom.

Figure 10:
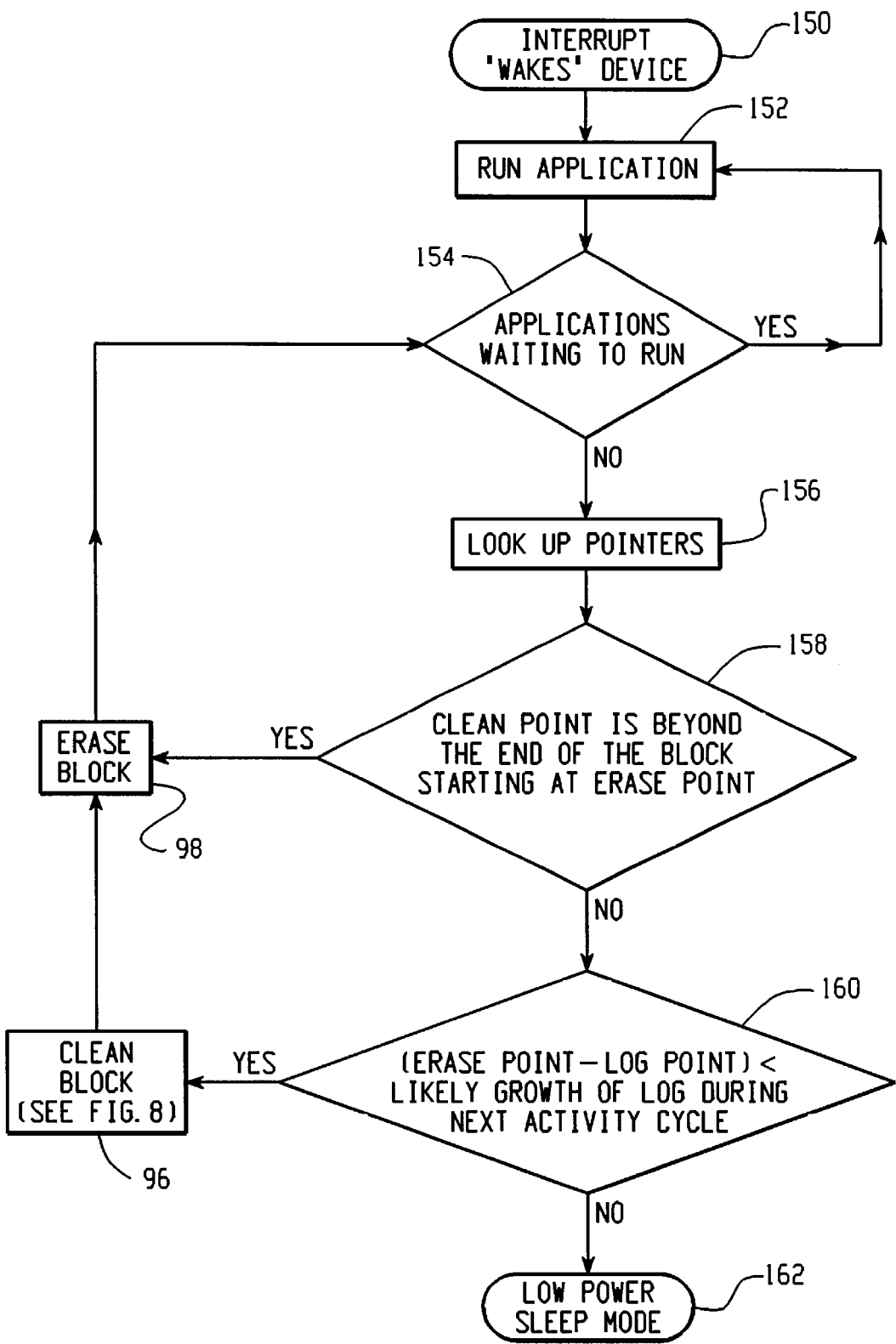
FIG. 10 is a flow chart describing a preferred mode of operation of the portable electronic device shown in FIG. 1, in which cleaning and erasing of the log structured file system is done when the device is idle.

In order to clean the log and create a new larger Log Headroom 54 at time T2 the file system copies the one active record 58 to the end of the log. Having written a new record to the end of the log, the Old Log Point 54C is changed to a position just after this new record 58—the New Log Point 54A. The system continues through the current erase block 51A by incrementing the Clean Point (and moving active records if found) until the Clean Point reaches the end of the erase block 51A. The erase block 51A is then erased. The "New Clean Point" 54B points to the beginning of the first active record; the next block 51B. Having erased block 51A, the Erase Point is also moved to the beginning of the next block 51B. Thus, the size of the new Log Headroom is the size of the old Log Headroom 54 plus the space previously occupied by the inactive records 60. In this manner, additional headroom has been created for appending new data records to the log. Preferably the system will immediately copy the active record to its new location during the clean operation, but it may defer the erase operation until the device 10 is idle. FIG. 10 describes this preferred mode of operation in more detail. This is done because the erase operation may take several seconds. In this manner, the user of the device does not have to wait while the system creates enough space in the log to save a particular data record.

Although FIGS. 3–5 show the creation of a single log for storing data in the portable electronic device 10, other configurations are possible. For example, the system could partition the flash memory store 24B to include two separate logs, one for relatively-volatile data records that change rapidly (the "hot" log) and one for relatively-involatile records that change slowly (the "cold" log). Or the system could partition the store 24B into more than two logs, or it could link the logs together in a variety of logical structures, depending upon the particular application of the portable electronic device 10.

Figure 6:
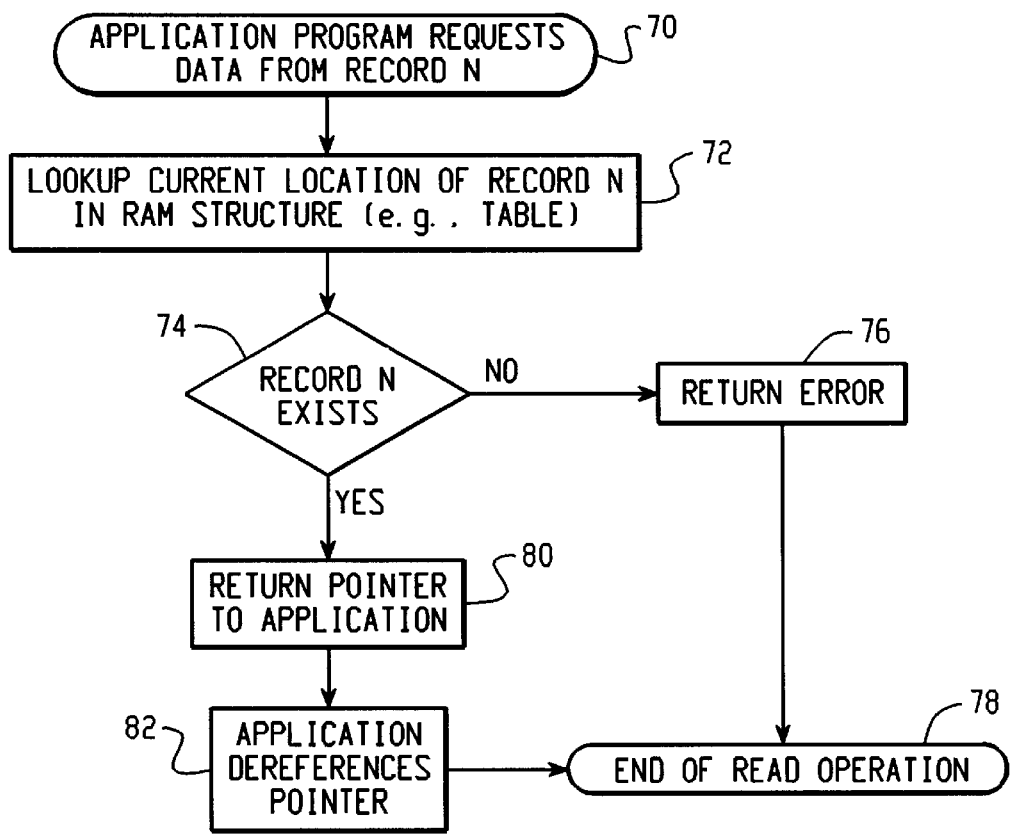
FIG. 6 is a flow chart showing a series of steps carried out by a preferred software implemented read module included in the log-structured file system.

Turning now to the remaining drawing figures, FIGS. 6–8 set forth flow charts describing a preferred series of software-implemented steps carried out by the modules of the log-structured file system 30 to read and write data to the log, and to clean the log. FIG. 6 is a flow chart showing a series of steps carried out by a preferred software-implemented read module included in the preferred log-structured file system of the present invention.

The read module methodology begins at step 70, where an application program (such as an e-mail application) requests data from a particular data record stored in the flash data store 24B. The read module looks up the current location of this record at step 72, preferably using a RAM-based index that stores a memory mapped pointer directly into the data store 24B. Alternatively, the lookup step 72 may use an indexing structure stored in flash memory 24B, or some other data store. At step 74, the read module determines whether or not the requested record exists in the flash store 24B. If not, then an error is returned to the application at step 76, and the read operation ends 78. If the record does exist, then at step 80, the read module returns a memory mapped pointer to the requesting application, such that the application can now directly reference the requested record. The application then dereferences the pointer at step 82 to access data stored in the record, and the read operation ends 78.

FIG. 7 is a flow chart showing a series of steps carried out by a preferred software implemented write module included in the preferred log-structured file system of the present invention. The methodology of the write module begins at step 90, in which an application program modifies some record data, or creates new record data. The module then determines the current system pointers at step 92. At step 94, the write module determines if sufficient Log Headroom 54 exists to append the modified data record by comparing the space between the Erase Point 54B and the Log Point 54B and the size of the modified (or new) record plus the minimum Log Headroom required to perform a clean operation. If sufficient headroom does not exist to complete the write operation, then control passes to step 96, where the next block of the flash memory is cleaned using the clean-log module, described below in connection with FIG. 8, and then to step 98, where the next block is erased.

But if sufficient headroom does exist at the end of the log 24B, then the write module "programs" the modified data record into the flash memory store 24B at step 100 starting at the current Log Point 54B. This programming step invokes "and-ing" the modified (or new) record data to the erased end of the log. At step 102, the Log Point 54B is modified by adding the size of the modified (or new) data record that was just programmed in step 100. Control then passes to step 104, in which the prior version of the data record (if there is one) is marked by flipping a flag in its header to indicate that the prior version is now an inactive record. The write operation then ends 106, and the file system is ready for another operation.

FIG. 8 is a flow chart showing a series of steps carried out by a preferred software implemented clean-log module included in the preferred log-structured file system of the present invention. The clean-log module operates to increase the Log Headroom to accommodate additional data records when the headroom becomes low. The clean-log module operates on a block basis, cleaning an entire flash block at a time.

The cleaning operation begins at step 110, in which the clean-log module is called from the write module, when the write module determines that Log Headroom 54 is low. The clean-log module then looks up the current Clean Point 54D at step 112. Control then passes to step 114, where the clean-log module initializes a Scan Point variable and sets it equal to the current Clean Point 54D. The Scan Point variable will be used to scan into the used portion of the log beyond the current Clean Point in order to determine which records to copy and which to discard. At this step, the module also sets an End Point variable equal to the end of the current erase block 51A containing the Clean Point 54D.

Having initialized the appropriate variables, the clean-log module then enters a loop 116–132, which is tested by the condition of whether the current Scan Point is equal to the End Point of the current block of flash memory (i.e., that the entire erase block 51A has been scanned.) For now, it is assumed that the Scan Point is not equal to the End Point. Thus, control of the clean-log enters the loop. At step 124, the module checks the header of the record located at the Scan Point to determine whether it is an active record or an inactive record. If the record at the Scan Point is inactive, then at step 126, control branches to step 132, where the Scan Point is incremented by the size of the current record. By incrementing the Scan Point in this manner, this record will be subsequently erased without being copied to the end of the log. If, however, at step 126 the module determined that the record at the Scan Point was an active record, then control branches to steps 128 and 130, in which the contents of the current record are appended to the end of the log, and the Log Point 54A is incremented by the size of the record. Having relocated the active record, control then passes to step 132, and the Scan Point is again incremented beyond this record. Steps 116–132 continue until the condition (Scan Point=End Point) is true.

Once the Scan Point reaches the end of the current erase block 51A, then control passes to step 120, in which the new Clean Point 54B is set to the current value of the Scan Point. The clean operation then terminates at step 122, and the log-structured file system is ready for another operation. Note that in FIG. 7, after the write module calls the clean-log module to clean a block, the block is immediately erased 98. However, this erase step 98 could be deferred until the device is idle (i.e., no applications are waiting to run) in order to minimize impact to the user.

FIG. 10 sets forth a preferred mode of operation of the portable electronic device shown in FIG. 1, in which the clean/erase operations are deferred until the device is idle. Beginning at step 150, an interrupt "wakes" the portable device 10, and an application is executed 152. This application may be reading and writing data to the log, and could be invoking the clean-log operation. At step 154, if applications are continuing to operate on the device 10, the system will loop between steps 152 and 154. During this time, erase will only happen if the device runs out of space.

Once the device goes idle—meaning no applications are waiting to run, control passes to step 158. At this point, the system determines if the current position of the Clean Point is beyond the end of the block demarcated by the current Erase Point. If so, then control passes to step 98, and this block is erased. The Erase Point is moved to the beginning of the next block, and control passes back to step 154 to see if additional application are waiting to run (i.e., the device is no longer in the idle state.)

If, at step 158, the system determined that the Clean Point is not beyond the end of the current erase block, then the system determines whether the current Log Headroom is less than the likely growth of the log during the next activity cycle. This can be determined by knowing the usage pattern of a typical device. If, at step 160, the system determines that it is likely that in the next activity cycle that the Log Headroom will be inadequate, then control passes to step 96, and the erase block is cleaned according to FIG. 8, and then erased 98. If there is sufficient Log Headroom, then the device simply enters a low-power sleep mode 162 where it waits for the next interrupt to occur.

The preferred embodiment of the invention described with reference to the drawing figures is presented only as an example of the technology, which is defined by the claims. Other elements, steps, methods and techniques that are insubstantially different from those described herein are also within the scope of the present invention.

What is claimed is:

1. A portable electronic device, including:
    a flash memory store comprising a plurality of erase blocks;
    a log-structured file system for storing a plurality of logs of contiguous data records in the flash memory store, for reading data from the flash memory store using a plurality of memory mapped pointers that point to the individual data records, and for cleaning inactive records from the flash memory store in order to make room for additional data, wherein at least one of the logs of contiguous data records stores records that change frequently, and at least one other log stores data records that change infrequently, and wherein the log-structured file system is configured to determine whether a current erase block into which a data record is to be stored includes available space to store the data record, and to clean inactive records from a next erase block adjacent to the current erase block in the flash memory store where the current erase block does not include available space to store the data record;
    wherein the log-structured file system further includes a plurality of pointers for managing the storing of data to the flash memory store and the cleaning of inactive records from the flash memory store;
    wherein the plurality of pointers includes a log point indicating a position in the current erase block at which the data record is to be stored, and an erase point indicating a beginning of the next erase block; and
    wherein the log-structured file system is further configured to determine an amount of available space in the current erase block by comparing the erase point and the log point.

2. The portable electronic device of claim 1, wherein the log-structured file system is configured to determine that the current erase block includes available space to store the data record where the amount of available space is greater than a size of the data record and a minimum space required for cleaning the next erase block.

3. The portable electronic device of claim 2, wherein the log-structured file system includes active records and inactive records, and wherein the plurality of pointers further includes a clean point indicating a position of a next active record after the erase point in the log-structured file system.

4. The portable electronic device of claim 3, wherein the log-structured file system is further configured to mark a particular record in the log-structured file system as inactive, and to move the clean point to a position of a next active record in the log-structured file system, when a new record replacing the particular record is written stored in the log-structured file system.

5. The portable electronic device of claim 4, wherein the log-structured file system is further configured to clean inactive records from the next erase block when the clean point is moved to an end of the next erase block.

6. The portable electronic device of claim 3, wherein the log-structured file system is further configured to copy active records from the next erase block to the current erase block, and to mark copied active records in the next erase block as inactive where the current erase block does not include available space to store the data record.

7. A method of managing a log-structured file system in a flash memory comprising a plurality of erase blocks, the log-structured file system storing a plurality of logs of contiguous records in the flash memory store, the method comprising the steps of:
    receiving a data record to be written into a current erase block in the flash memory store;
    determining whether the current erase block includes available space to write the data record; and
    cleaning inactive records from a next erase block adjacent to the current erase block in the flash memory store where the current erase block does not include available space to write the data record;
    wherein the log-structured file system further comprises a plurality of pointers, the plurality of pointers including a log point indicating a position in the current erase block at which the data record is to be written, and an erase point indicating a beginning of the next erase block, and wherein the step of determining whether the current erase block includes available space to write the data record comprises the step of determining an amount of available space between the erase point and the log point.

8. The method of claim 7, wherein the step of receiving a data record comprises the step of receiving a data record from one of a plurality of application programs that read and write data to the flash memory store using the log-structured file system.

9. The method of claim 8, wherein the plurality of application programs include: an e-mail application and at least one of an organizer application, a calendar application, a to-do list application, an address book application, a billable hours application and a timecard application.

10. The method of claim 7, wherein the step of determining whether the current erase block includes available space to write the data record further comprises the step of determining whether the amount of available space is greater than a size of the data record and a minimum space required for cleaning the next erase block.

11. The method of claim 7, wherein the log-structured file system includes active records and inactive records, and wherein the- step of cleaning inactive records from a next erase block comprises the steps of copying active records from the next erase block to the current erase block, marking copied active records in the next erase block as inactive, and cleaning the inactive records in the next erase block when all active records in the next erase block have been copied to the current erase block and marked as inactive.

12. The method of claim 7, wherein the log-structured file system includes active records and inactive records, further comprising the steps of:

determining whether the next erase block includes active records; and cleaning inactive records in the next erase block where the next erase block includes no active records.

* * * * *